(12) United States Patent
Saito

(10) Patent No.: US 10,983,158 B2
(45) Date of Patent: Apr. 20, 2021

(54) METHOD FOR EVALUATING CRYSTAL DEFECTS

(71) Applicant: SHIN-ETSU HANDOTAI CO., LTD., Tokyo (JP)

(72) Inventor: Hisayuki Saito, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 165 days.

(21) Appl. No.: 16/328,884

(22) PCT Filed: Aug. 16, 2017

(86) PCT No.: PCT/JP2017/029419
§ 371 (c)(1),
(2) Date: Feb. 27, 2019

(87) PCT Pub. No.: WO2018/047590
PCT Pub. Date: Mar. 15, 2018

(65) Prior Publication Data
US 2019/0212384 A1    Jul. 11, 2019

(30) Foreign Application Priority Data

Sep. 7, 2016 (JP) .............................. JP2016-174649

(51) Int. Cl.
*G01R 31/28* (2006.01)
*C30B 29/06* (2006.01)

(52) U.S. Cl.
CPC .......... *G01R 31/2831* (2013.01); *C30B 29/06* (2013.01)

(58) Field of Classification Search
CPC ............................. G01R 31/2831; C30B 29/06
See application file for complete search history.

(56) References Cited

U.S. PATENT DOCUMENTS

2007/0186845 A1    8/2007   Umeno
2008/0153186 A1*   6/2008   Saito ....................... H01L 22/24
                                                                 438/16
(Continued)

FOREIGN PATENT DOCUMENTS

JP    2007-191350 A    8/2007
JP    2010-056264 A    3/2010
(Continued)

OTHER PUBLICATIONS

Sep. 26, 2017 International Search Report issued in International Patent Application No. PCT/JP2017/029419.

*Primary Examiner* — Son T Le
*Assistant Examiner* — Adam S Clarke
(74) *Attorney, Agent, or Firm* — Oliff PLC

(57) ABSTRACT

A method for evaluating crystal defects by which a distribution of the crystal defects present in a silicon wafer is evaluated, includes forming an oxide film having a thickness equal to a crystal defect size to be evaluated on the silicon wafer, measuring GOI characteristics of the silicon wafer, and obtaining the distribution of the crystal defects having the crystal defect size to be evaluated in the silicon wafer from a measurement result of the GOI characteristics on a supposition that the crystal defects whose size is equivalent to the thickness of the oxide film are present in a region where the GOI characteristics are degraded. Consequently, the method for evaluating crystal defects by which a distribution of the crystal defects can be obtained even if a crystal defect size is 10 nm or less.

4 Claims, 5 Drawing Sheets

(56) References Cited

U.S. PATENT DOCUMENTS

2016/0160388 A1* 6/2016 Hong .................. C30B 15/00
                                                                423/348
2018/0136143 A1* 5/2018 Kato .................. G01B 11/30

FOREIGN PATENT DOCUMENTS

| JP | 2015-154065 A | 8/2015 |
| JP | 2016-103528 A | 6/2016 |

* cited by examiner

[FIG. 1]
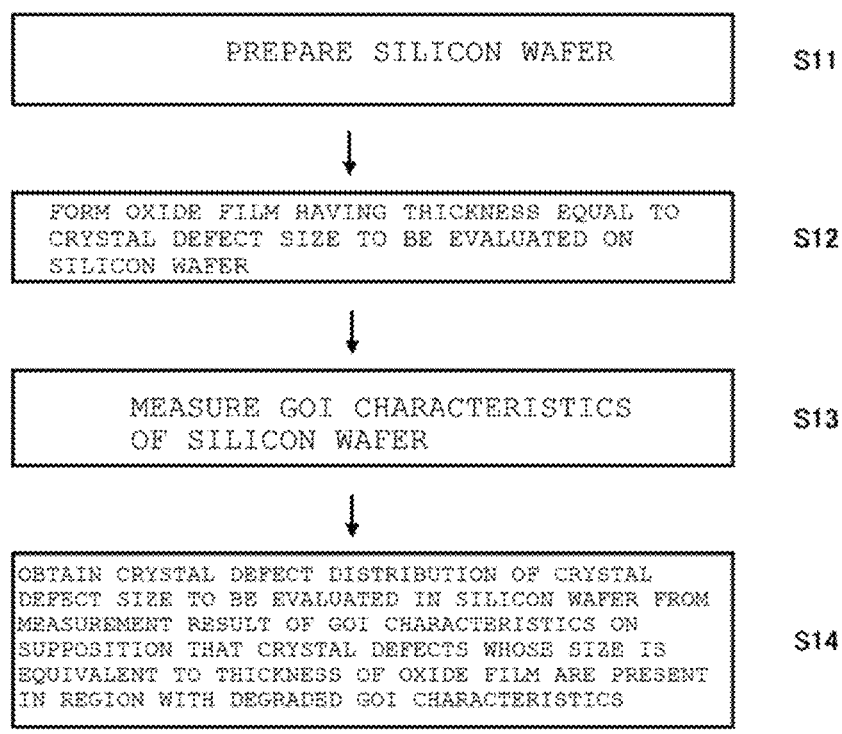

[FIG. 2]
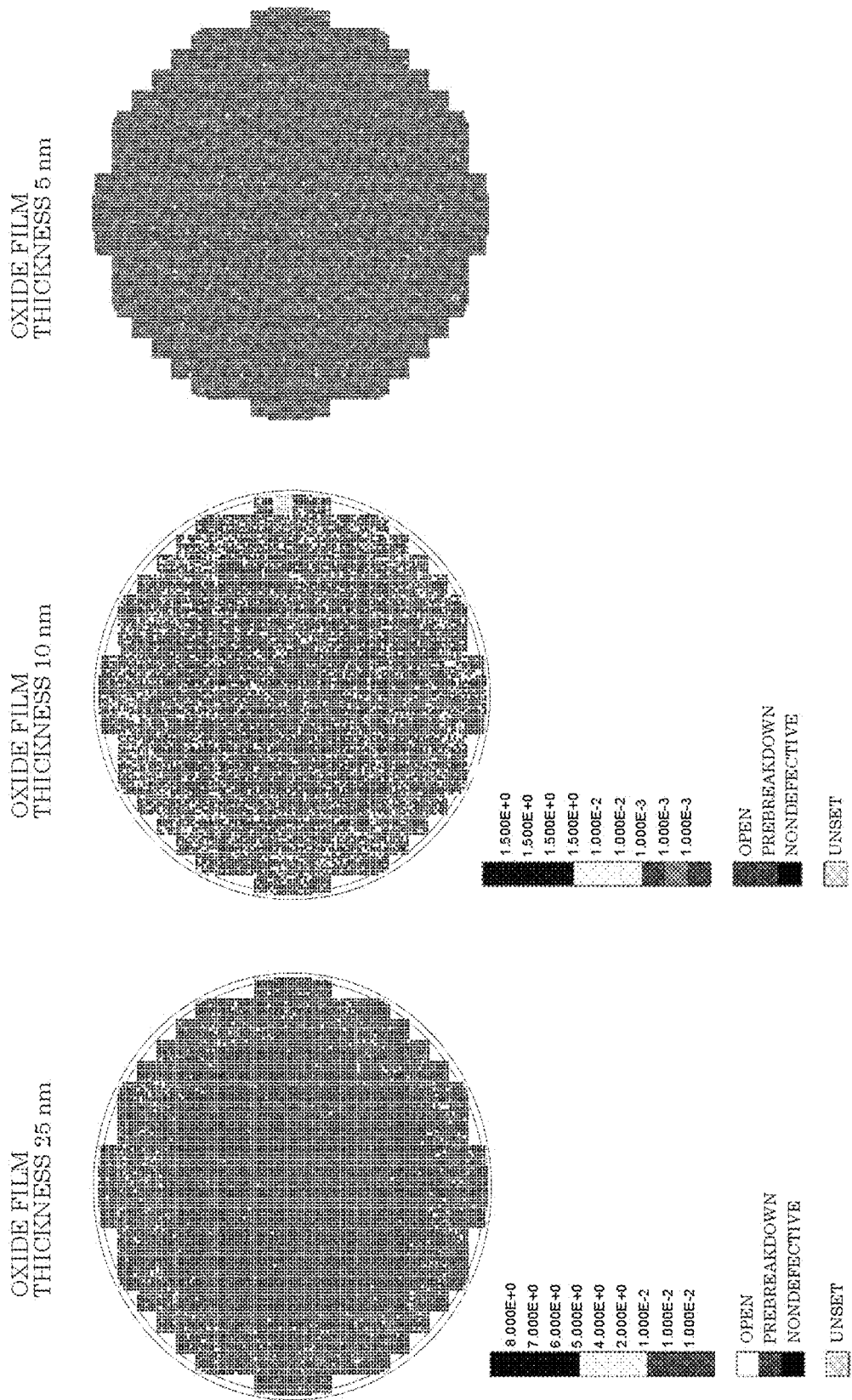

[FIG. 3]
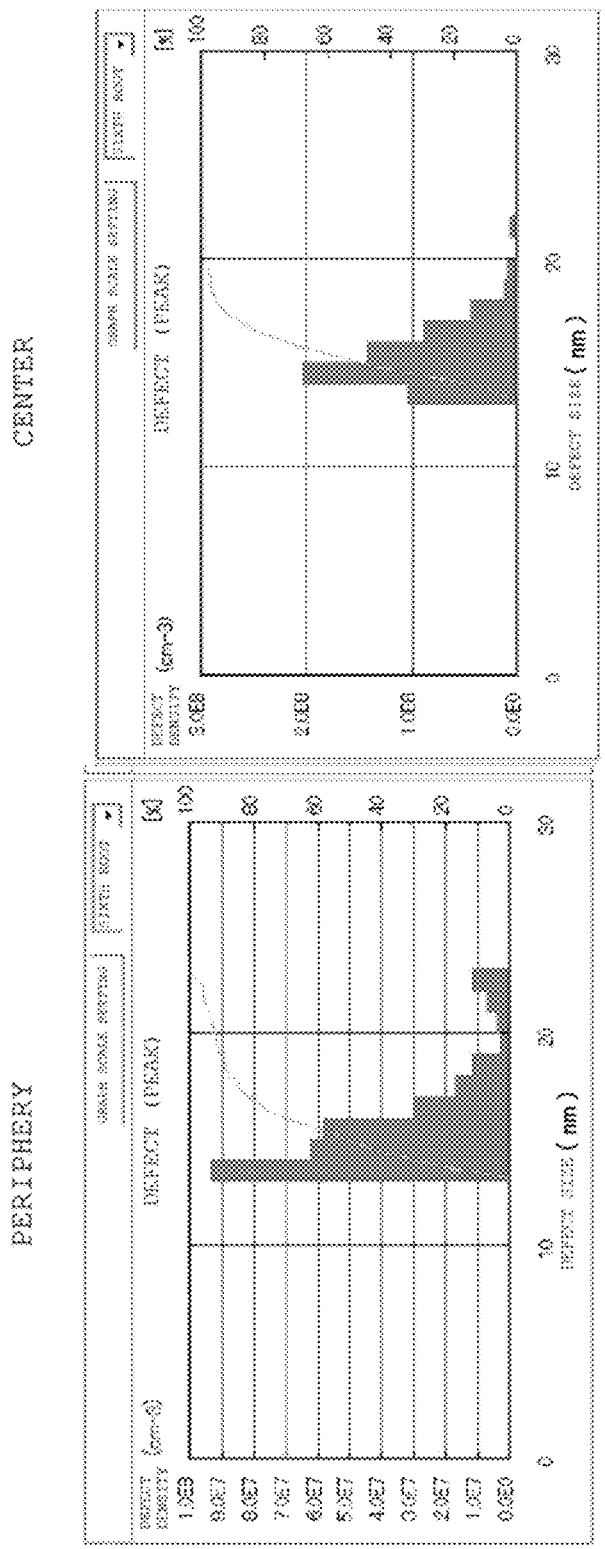

[FIG. 4]
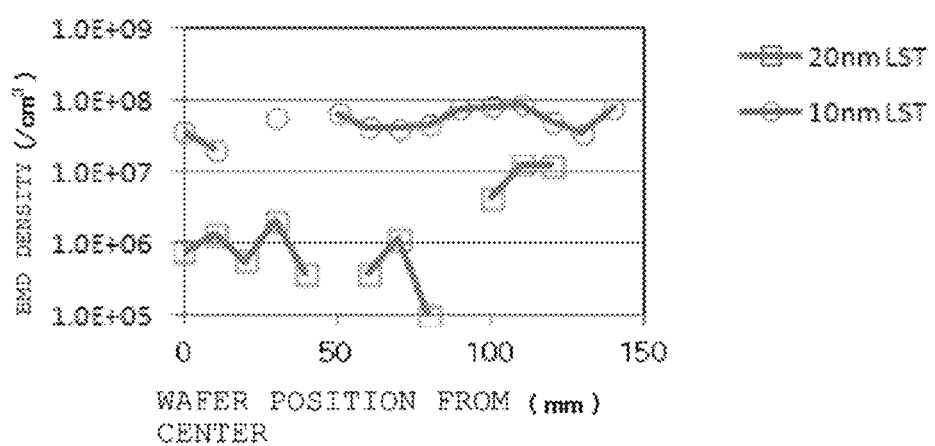

[FIG. 5]
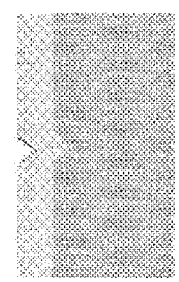 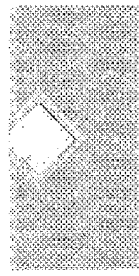 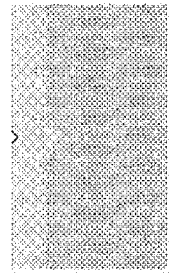
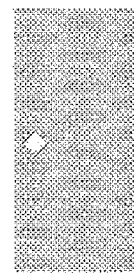 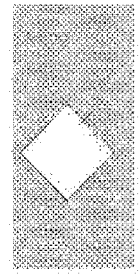 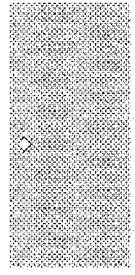
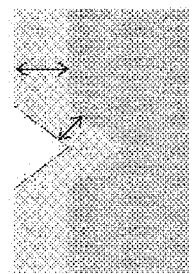 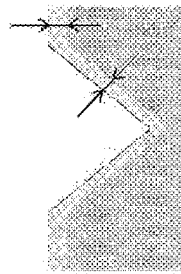 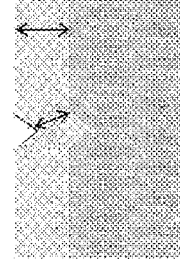
(a) DEFECT = FILM THICKNESS — ELECTRIC FIELD CONCENTRATION OCCURS SINCE THIN OXIDE FILM IS FORMED
(b) DEFECT > FILM THICKNESS — OXIDE FILM THICKNESS DOES NOT CHANGE
(c) DEFECT < FILM THICKNESS — OXIDE FILM THICKNESS DOES NOT CHANGE

METHOD FOR EVALUATING CRYSTAL DEFECTS

TECHNICAL FIELD

The present invention relates to a method for evaluating crystal defects.

BACKGROUND ART

Even though an oxide film of silicon has very excellent insulating properties, it can be formed in a simple process which is a heat treatment in an oxidizing atmosphere, and hence it is widely used in a device process. When a gate oxide film is expressed in terms of a thickness, a high voltage is applied, and hence a high-quality film is demanded.

Further, it is known that, when a wafer contains crystal defects (which may be simply referred to as defects hereinafter), they are taken into a gate oxide film to form a defective oxide film, which can be a cause of device failures.

As an oxide dielectric breakdown voltage (GOI) evaluation method for detecting such a defective oxide film, there is a TDDB method. This method is a method for continuously keeping application of a fixed voltage or current to an insulator film, detecting a current or a voltage at predetermined time intervals to obtain changes with time, and evaluating a time to reach a dielectric breakdown, its process, and others in detail.

As a mechanism to bring about an insulator film breakdown in the TDDB method, a percolation model has been suggested. This is a probability model which divides, e.g., a silicon oxide film into a mesh structure to form minute cells, estimates a probability that each cell breaks down, and assumes that a dielectric breakdown occurs when broken-down cells form a line in a thickness direction of the oxide film.

According to this mechanism, when a weak spot is present in the oxide film, defects in the oxide film increase with time, a distance between the defects decreases to facilitate movement of electrons, and a current path is finally formed, resulting in a dielectric breakdown.

That is, if a small weak spot is present in the oxide film, it grows and leads to a film breakdown. Thus, it has been considered that even a defect whose actual size is unknown but which is sufficiently small for an oxide film thickness becomes a defect which leads to the oxide film breakdown.

CITATION LIST

Patent Literature

Patent Literature 1: Japanese Unexamined Patent Publication (Kokai) No. 2007-191350

SUMMARY OF INVENTION

Technical Problem

However, according to the study of the present inventor, a high-sensitivity LST (Laser Scattering Tomography) has been recently developed, whereby each void whose size is approximately 10 nm can be directly observed. Consequently, it has been revealed that, when an oxide film thickness and a crystal defect size (which may be simply referred to as a defect size hereinafter) are equivalent to each other such as a conventional oxide film thickness of 25 nm and the LST sensitivity of 20 nm, LST defect density and an oxide dielectric breakdown voltage show a very excellent correlation, but density of voids having a size of 10 nm cannot obtain a correlation with a dielectric breakdown voltage of the oxide film having the thickness of 25 nm.

Table 1, FIG. 1, and the paragraphs 17 to 19 in Patent Literature 1 illustrate that an oxide film thickness is set to 71 nm, 83 nm, and 108 nm, and GOI yields, GOI defect densities, and GOI defect minimum sizes in such situations are obtained. However, a distribution of micro defects which are hardly detected by a measuring instrument having a defect size detection limit of approximately 10 nm cannot be obtained from a GOI measurement result of such oxide film thicknesses.

It is to be noted that the void (COP) which is a target in Patent Literature 1 has a size of 40 nm or more which is very easy to measure, but an object is not detection of defects having a size of approximately 10 nm which is hardly detected by the measuring instrument.

Further, as regards how to obtain a defect size in Patent Literature 1, defects having a predetermined size are not formed, but a minimum size of GOI defects is obtained from density of all COPs (cumulative defect density) detected by an OPP (Optical Precipitate Profiler) and GOT failures (a GOI yield) on the assumption that COPs having relatively large sizes degrade the GOI. That is, a relationship between a defect size and a GOI failure is not confirmed.

Actually, in the measurement of Patent Literature 1, a good chip yield (the GOI yield) 99.1% on the level of a gate oxide film thickness of 108 nm means that the number of failures is only two in 229 measuring points, and an accuracy is unreasonable when this good chip yield is used to calculate the density (the GOI defect density).

As described above, the crystal defect size which degrades the oxide dielectric breakdown voltage is larger than previously considered and equivalent to a thickness of each oxide film, and it is important to detect small defects which have been overlooked in conventional thick oxide films and have a correlation with GOI characteristics of thin oxide films. However, a defect density measuring instrument of the LST or the like has a detection limit, and it has a problem that detecting small defects which are 10 nm or less is difficult.

In view of the problem, it is an object of the present invention to provide a method for evaluating crystal defects by which a distribution of the crystal defects can be obtained even in case of a crystal defect size which is 10 nm or less.

Solution to Problem

To achieve the problem, the present invention provides a method for evaluating crystal defects by which a distribution of the crystal defects present in a silicon wafer is evaluated, including:

forming an oxide film having a thickness equal to a crystal defect size to be evaluated on the silicon wafer, measuring GOI characteristics of the silicon wafer, and obtaining the distribution of the crystal defects having the crystal defect size to be evaluated in the silicon wafer from a measurement result of the GOI characteristics on a supposition that the crystal defects whose size is equivalent to the thickness of the oxide film are present in a region where the GOI characteristics are degraded.

Since defects whose size is half to double an oxide film thickness degrade an oxide dielectric breakdown voltage, forming an oxide film having a thickness equal to a crystal defect size to be evaluated on the silicon wafer, measuring GOI characteristics of the silicon wafer, and obtaining the distribution of the crystal defects having the crystal defect size to be evaluated in the silicon wafer from a measurement result of the GOI characteristics on a supposition that the crystal defects whose size is equivalent to the thickness of the oxide film are present in a region where the GOI characteristics are degraded as described above can eliminate the need for using a defect density measuring instrument of the LST or the like, and enable checking density or a distribution of small crystal defects which cannot be measured in conventional examples.

At this time, it is preferable to set a plurality of the crystal defect sizes to be evaluated, and obtain the distribution of the crystal defects by each crystal defect size in the silicon wafer.

In this manner, the crystal defect distribution for each crystal defect size can be easily obtained.

At this time, it is preferable that the crystal defect size to be evaluated is 10 nm or less.

When the crystal defect size to be evaluated is 10 nm or less, the void cannot be directly observed even if the LST is used, and the defect density cannot be measured, and hence it is possible to preferably use the method for evaluating crystal defects according to the present invention which does not adopt a defect density measuring instrument of the LST or the like.

Advantageous Effects of Invention

As described above, when the method for evaluating crystal defects according to the present invention is used, an oxide film whose thickness is the same as a crystal defect size to be evaluated is formed on a silicon wafer, GOI characteristics of the silicon wafer are measured, and the distribution of the crystal defects having the crystal defect size to be evaluated in the silicon wafer is obtained from a measurement result of the GOI characteristics, and hence density or a distribution of the crystal defects whose sizes are 10 nm or below which cannot be measured in conventional examples can be checked without the need for a defect density measuring instrument of the LST or the like.

BRIEF DESCRIPTION OF DRAWINGS

FIG. 1 is a flowchart showing a method for evaluating crystal defects according to the present invention;

FIG. 2 is a view showing GOI characteristics on each oxide film thickness level;

FIG. 3 is a view showing defect size distributions at a peripheral portion and a central portion of a sample according to Example;

FIG. 4 is a view showing defect-size-specific radial distribution when defects having a size of 20 nm or more and defects having a size of 10 nm or more are actually measured by using an LST in the sample of Example; and FIG. 5 is a view illustrating that an oxide dielectric breakdown voltage is not affected even when each defect size is too big or too small for a thickness of an oxide film.

DESCRIPTION OF EMBODIMENTS

Although the present invention will now be described as an embodiment in detail hereinafter with reference to the drawings, the present invention is not restricted thereto.

As described above, there is a TDDB method as a method for evaluating an oxide dielectric breakdown voltage (GOI) to detect a defective oxide film, and a percolation model has been suggested as a mechanism which brings about an insulator film breakdown in the TDDB method. According to this mechanism, when there is a small weak spot in an oxide film, it grows and leads to a film breakdown. Thus, it has been considered that even a small defect whose actual size is unknown but which is sufficiently small to an oxide film thickness can become a defect which leads to the oxide film breakdown.

However, it has been revealed that, in a case where the high-sensitivity LST which enables directly observing a void whose size is approximately 10 nm is used, when an oxide film thickness and a defect size are equivalent to each other such as a conventional oxide film thickness of 25 nm and the LST sensitivity of 20 nm, defect density measured by the LST and an oxide dielectric breakdown voltage show a very excellent correlation, but void density (defect density) having a defect size of 10 nm and a breakdown voltage of the oxide film having a thickness of 25 nm cannot obtain a correlation.

As described above, the crystal defect size which degrades the oxide dielectric breakdown voltage is larger than previously considered and equivalent to the thickness of the oxide film, and detecting small defects which have been missed in conventional thick oxide films and have a correlation with the GOI characteristics of thin oxide films has become important. However, a defect density measuring instrument of the LST or the like has a detection limit, and has a problem that detecting small defects of 10 nm or less is difficult.

Thus, the present inventor has keenly examined a method for evaluating crystal defects by which a distribution of the crystal defects can be obtained even when a crystal defect size is 10 nm or less. Consequently, the present inventor has discovered that forming an oxide film having a thickness equal to a crystal defect size to be evaluated on a silicon wafer, measuring GOI characteristics of the silicon wafer, and obtaining the distribution of the crystal defects having the crystal defect size to be evaluated in the silicon wafer from a measurement result of the GOI characteristics on a supposition that the crystal defects whose size is equivalent to the thickness of the oxide film are present in a region where the GOI characteristics are degraded can eliminate the need for using a defect density measuring instrument of the LST or the like, and enable checking density or a distribution of small crystal defects which cannot be measured in conventional examples, thus bringing the present invention to completion.

The method for evaluating crystal defects according to the present invention will now be described with reference to FIG. 1.

First, a silicon wafer is prepared (see S11 in FIG. 1).

Then, an oxide film having a thickness which is the same as a crystal defect size to be evaluated is formed on the prepared silicon wafer (see S12 in FIG. 1). Here, a silicon oxide film can be used as the oxide film, and forming the silicon oxide film by thermal oxidation is preferable.

Subsequently, GOI characteristics of the silicon wafer having the oxide film formed thereon are measured (see S13 in FIG. 1). The GOI characteristics can be measured by the TDDB method described above. Further, to obtain an accurate defect density, it is preferable to measure the GOT characteristics at as many measuring points as possible on an entire surface of the silicon wafer.

Then, on a supposition that crystal defects whose size is equivalent to the thickness of the oxide film are present in a region where the GOI characteristics have been degraded (namely, the measuring points at which the GOI characteristics have been degraded), a crystal defect distribution of the crystal defect size to be evaluated in the silicon wafer is obtained from a measurement result of the GOI characteristics (see S14 in FIG. 1). Here, "equivalent" in the present invention means half to double. It is considered that the crystal defects whose size is equivalent to the thickness of the oxide film are present in the region where the GOI characteristics have been degraded because it is thought that an oxide dielectric breakdown voltage is not affected even when the defect size is too large or too small to the thickness of the oxide film. That is, as shown in FIG. 5(a), when the size of the defect is equivalent to the thickness of the oxide film, since the thickness of the oxide film at a position of the defect becomes smaller than the thickness of the oxide film at the periphery thereof, it is considered that electric field concentration occurs and the GOI characteristics are degraded. Further, as shown in FIG. 5(b), when the size of the defect is larger than the thickness of the oxide film, the thickness of the oxide film at the position of the defect is the same as the thickness of the oxide film at the periphery thereof, and hence it can be considered that the GOT characteristics are not degraded. Moreover, as shown in FIG. 5(c), when the size of the defect is smaller than the thickness of the oxide film, the thickness of the oxide film at the position of the defect is the same as the thickness of the oxide film at the periphery thereof, and hence it can be considered that the GOT characteristics are not degraded. Thus, it is appropriate to consider each defect whose size is half to double the thickness of the oxide film which affects the oxide dielectric breakdown voltage to be "equivalent". It has been confirmed by way of experiment that this is correct from data of a later-described Example.

As described above, the oxide film having the thickness equal to the crystal defect size to be evaluated is formed on the silicon wafer, the GOI characteristics of the silicon wafer are measured, and the distribution of the crystal defects having the crystal defect size to be evaluated in the silicon wafer is obtained from a measurement result of the GOI characteristics, thus a defect density measuring instrument of the LST or the like does not have to be used, and density and a distribution of small crystal defects which cannot be measured in conventional examples can be checked, respectively.

In the method for evaluating crystal defects according to the present invention, it is preferable to set a plurality of the crystal defect sizes to be evaluated and obtain the distribution of the crystal defects by each crystal defect size in the silicon wafer.

Specifically, a plurality of silicon wafers are prepared at S11 in FIG. 1, oxide films having a plurality of types of thicknesses corresponding to a plurality of sizes of crystal defects to be evaluated are formed on the plurality of prepared silicon wafers respectively at S12 in FIG. 1, GOI characteristics of the plurality of silicon wafers having the oxide films with the different film thicknesses formed thereon respectively are measured at S13 in FIG. 1, and the distribution of the crystal defects by each crystal defect size in the silicon wafers can be obtained from a plurality of measurement results of the GOI characteristics at S14 in FIG. 1.

Here, in case of preparing the plurality of silicon wafers at S11 in FIG. 1, the plurality of silicon wafers to be prepared are preferably sliced out from a silicon single crystal of the same lot. That is because defect sizes and defect distributions become substantially equal in this case.

As described above, in the present invention, the distribution of the crystal defects by each crystal defect size can be easily obtained.

In the method for evaluating crystal defects according to the present invention, the size of the crystal defect to be evaluated is preferably 10 nm or less. When the crystal defect size to be evaluated is 10 nm or less, voids cannot be directly observed even if the LST is used, and defect density cannot be measured, and hence the method for evaluating crystal defects according to the present invention which does not use a defect density measuring instrument of the LST or the like can be preferably adopted. Further, a lower limit of the crystal defect size to be evaluated is not restricted in particular, but any size which is larger than 0 nm can be set.

EXAMPLE

Although the present invention will now be more specifically described with reference to an example, the present invention is not restricted thereto.
Example Oxide dielectric breakdown voltages were measured in three silicon wafers with a diameter of 300 mm which have three types of oxide films with an oxide film thickness of 5 nm, 10 nm, or 25 nm formed thereon respectively and had been sliced out from a silicon single crystal of the same lot. Here, it is considered that the silicon wafers sliced out from the silicon single crystal of the same lot have substantially the same defect distributions.

Furthermore, since the oxide dielectric breakdown voltage is usually measured at only a part of a silicon wafer (1% to 10% in terms of an area), defects are often missed when defect density is low, and the misunderstanding that a GOI failure does not occur even if the defects are present may be caused. An entire surface is often measured to prevent the defects from being missed, but an area per point is increased in a usual method since the measurement is easy, for example. However, in this case, a problem that accurate defect distribution becomes unclear occurs. Thus, as to the oxide dielectric breakdown voltages in this example, a pattern obtained by laying 14700 patterns each having a 2×2 $mm^2$ size was used, and the entire surface was finely measured.

FIG. 2 shows a measurement result of the oxide dielectric breakdown voltages.

As can be understood from FIG. 2, the result is that, even though the three silicon wafers have the same defect distribution, the defect distribution differs depending on each oxide film thickness.

The defect distributions estimated from this result are as follows.

1) Many of defects having a size of approximately 25 nm are present at the periphery, and they are not present at the center.

2) Defects having a size of approximately 10 nm are present on the entire wafer, and their density increases at the periphery.

3) Defects having a size of approximately 5 nm has low density as a whole.

As described above, a detection size limit of a conventional measuring instrument (the defect density measuring instrument) is approximately 10 nm but, in the present invention, when an oxide film with an oxide film thickness which is equivalent to a defect size to be detected is formed and the GOI measurement is performed, it is possible to obtain a defect distribution even if a defect size is approximately 5 nm which cannot be detected by the measuring instrument.

A radial distribution and sizes of voids in each sample were confirmed by using the high-sensitivity LST, and a result show in FIG. 3 was obtained.

As can be understood from FIG. 3, the periphery and the center are different in presence/absence of defects having a size of 20 nm or more. That is, the GOI failure at the periphery of the wafer having the oxide film thickness of 25 nm in FIG. 2 is considered to be caused by defects whose size is 20 nm or more. Furthermore, it is considered that a non-defective product is obtained at the center from the GOI of the wafer having the oxide film thickness of 25 nm in FIG. 2, but a defective product is obtained at the center of the wafer having the oxide film thickness of 10 nm in FIG. 2 due to an influence of defects whose size is 20 nm or less.

Then, the LST was used to actually measure defects whose size is 20 mm or more and defect whose size is 10 nm or more in the same wafers as those described above. The radial distribution for each defect size will be shown in FIG. 4.

As can be understood from FIG. 4, the defects whose size is 20 nm or more are less present at the center but abundantly present at the periphery. This coincides with the result of the GOI when the oxide film thickness is 25 nm in FIG. 2. Moreover, the defects whose size is 10 nm or more are uniformly produced within a plane, and this coincides with the result of the GOI when the oxide film thickness is 10 nm in FIG. 2.

The radial distribution for each defect size obtained by the present invention coincides with the radial distribution of the defects for each size actually measured by the LST as described above, and it can be understood that the actual radial distribution of each defect size is reflected in the defect distribution obtained by the present invention.

Further, according to the present invention, when the oxide film thickness is reduced to be smaller than 10 nm and the GOI is measured, it is possible to obtain a radial distribution of defects having a size of 10 nm or less which cannot be detected by the LST.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A method for evaluating crystal defects by which a distribution of the crystal defects present in a silicon wafer is evaluated, comprising:
    forming an oxide film having a thickness equal to a crystal defect size to be evaluated on the silicon wafer,
    measuring Gate Oxide Integrity (GOI) characteristics of the silicon wafer, and
    obtaining the distribution of the crystal defects having the crystal defect size to be evaluated in the silicon wafer from a measurement result of the GOI characteristics on a supposition that the crystal defects whose size is equivalent to the thickness of the oxide film are present in a region where the GOI characteristics are degraded.

2. The method for evaluating crystal defects according to claim 1,
    wherein a plurality of the crystal defect sizes to be evaluated are set, and the distribution of the crystal defects by each crystal defect size in the silicon wafer is obtained.

3. The method for evaluating crystal defects according to claim 1, wherein the crystal defect size to be evaluated is 10 nm or less.

4. The method for evaluating crystal defects according to claim 2, wherein the crystal defect size to be evaluated is 10 nm or less.

* * * * *